(12) United States Patent
Hampsch et al.

(10) Patent No.: US 9,464,354 B2
(45) Date of Patent: Oct. 11, 2016

(54) CUTTING TOOL WITH WEAR-RECOGNITION LAYER

(71) Applicant: Walter AG, Tübingen (DE)

(72) Inventors: Sebastian Hampsch, Ostfildern (DE); Veit Schier, Leinfelden-Echterdingen (DE)

(73) Assignee: Walter AG, Tübingen (DE)

( * ) Notice: Subject to any disclaimer, the term of this patent is extended or adjusted under 35 U.S.C. 154(b) by 0 days.

(21) Appl. No.: 14/414,727

(22) PCT Filed: Jul. 23, 2013

(86) PCT No.: PCT/EP2013/065547
§ 371 (c)(1),
(2) Date: Jan. 14, 2015

(87) PCT Pub. No.: WO2014/019896
PCT Pub. Date: Feb. 6, 2014

(65) Prior Publication Data
US 2015/0167176 A1 Jun. 18, 2015

(30) Foreign Application Priority Data
Aug. 3, 2012 (DE) .................. 10 2012 107 130

(51) Int. Cl.
*C23C 14/34* (2006.01)
*C23C 28/00* (2006.01)
(Continued)

(52) U.S. Cl.
CPC ......... *C23C 28/347* (2013.01); *C23C 14/0015* (2013.01); *C23C 14/08* (2013.01);
(Continued)

(58) Field of Classification Search
USPC .......... 51/307, 309; 428/216, 336, 697, 698, 428/699, 701, 702, 704
See application file for complete search history.

(56) References Cited

U.S. PATENT DOCUMENTS 6,682,274 B2  1/2004  Votsch et al.
7,695,222 B2 *  4/2010  Omori ................... B23B 27/143
                                                    407/119
(Continued)

FOREIGN PATENT DOCUMENTS

AT       502 526 B1    9/2009
CN       101678467     3/2010
(Continued)

OTHER PUBLICATIONS

International Preliminary Report on Patentability dated Feb. 3, 2015, for International application No. PCT/EP2013/065547.
(Continued)

*Primary Examiner* — Archene Turner
(74) *Attorney, Agent, or Firm* — Morgan, Lewis & Bockius LLP

(57) ABSTRACT

Tool with optional wear-protection coating has, as an outer layer arranged on top of the substrate body or wear-protection coating, a single-layer wear-recognition layer (A) or a multilayer wear-recognition layer (B) comprising at least 4 individual layers arranged one above another, said layer or layers being produced by depositing elemental metals, metal alloys or electrically conductive metal compounds with a PVD process. Individual layer of (A) or at least one individual layer of (B) contain at least two different metals, the wear-recognition layer comprises a region produced by anodic oxidation from the upper surface down to a penetration depth that does not extend over the entire thickness of the wear-recognition layer, and the individual layer of (A) or the at least one individual layer of (B) has at least two different phases before the anodic oxidation and in the regions of the wear recognition layer that are not anodically oxidized.

20 Claims, 5 Drawing Sheets

(51) Int. Cl.
*C23C 14/00* (2006.01)
*C23C 14/08* (2006.01)
*C23C 14/16* (2006.01)
*C23C 14/18* (2006.01)
*C23C 14/35* (2006.01)
*C23C 14/58* (2006.01)
*C23C 28/04* (2006.01)
*C23C 30/00* (2006.01)
*C25D 11/04* (2006.01)
*C25D 11/26* (2006.01)
*C25D 11/32* (2006.01)
*C25D 11/02* (2006.01)

(52) U.S. Cl.
CPC ............ *C23C 14/16* (2013.01); *C23C 14/165* (2013.01); *C23C 14/18* (2013.01); *C23C 14/185* (2013.01); *C23C 14/3485* (2013.01); *C23C 14/35* (2013.01); *C23C 14/5853* (2013.01); *C23C 14/5873* (2013.01); *C23C 28/042* (2013.01); *C23C 28/044* (2013.01); *C23C 28/321* (2013.01); *C23C 28/345* (2013.01); *C23C 28/40* (2013.01); *C23C 28/42* (2013.01); *C23C 30/005* (2013.01); *C25D 11/02* (2013.01); *C25D 11/04* (2013.01); *C25D 11/26* (2013.01); *C25D 11/32* (2013.01); *Y10T 428/1259* (2015.01); *Y10T 428/24975* (2015.01); *Y10T 428/265* (2015.01)

(56) References Cited

U.S. PATENT DOCUMENTS

| | | |
|---|---|---|
| 7,758,975 B2 | 7/2010 | Schier |
| 7,964,295 B2 | 6/2011 | Ahlgren |
| 8,354,177 B2 | 1/2013 | Maeda et al. |
| 8,709,583 B2 | 4/2014 | Schier et al. |
| RE45,719 E | 10/2015 | Maeda et al. |
| 2011/0183131 A1* | 7/2011 | Maeda .................. B23F 21/00 428/216 |

FOREIGN PATENT DOCUMENTS

| | | |
|---|---|---|
| CN | 102292467 | 12/2011 |
| DE | 23 66 512 C2 | 7/1983 |
| DE | 101 18 763 A1 | 10/2002 |
| DE | 100 48 899 B4 | 4/2004 |
| DE | 10 2004 010 285 A1 | 9/2005 |
| EP | 0 693 574 B2 | 4/2001 |
| EP | 0 980 917 B1 | 7/2002 |
| EP | 1 762 638 A2 | 3/2007 |
| EP | 1 674 597 B1 | 1/2008 |
| GB | 1 389 140 A | 4/1975 |
| JP | 03002385 A | 1/1991 |
| JP | 2004-299023 A | 10/2004 |
| WO | 2004/087994 A1 | 10/2004 |
| WO | 2011/085796 A1 | 7/2011 |
| WO | 2013/037967 A1 | 3/2013 |

OTHER PUBLICATIONS

International Search Report dated Dec. 5, 2013 for International application No. PCT/EP2013/065547.

German Search Report in DE 10 2012 107 130.6 dated Mar. 20, 2013.

English translation of Notification of First Office Action for Chinese Application No. 2013-80041233.X, dated Nov. 24, 2015.

* cited by examiner

CUTTING TOOL WITH WEAR-RECOGNITION LAYER

RELATED APPLICATIONS

The present application is a U.S. National Phase Application of International Application No. PCT/EP2013/065547, filed 23 Jul. 2013, which claims priority to German Application No. 10 2012 107 130.6, filed 3 Aug. 2012.

OBJECT OF THE INVENTION

The present invention relates to a tool, consisting of a substrate body, preferably made of hard metal, cermet, ceramic, steel or high-speed steel, optionally a single-layer or multi-layer wear protection coating deposited on the substrate body and a wear recognition layer arranged as the outermost layer over the substrate body or wear protection coating, and to a method for the production of the tool.

BACKGROUND OF THE INVENTION

Cutting tools, particularly those for metal-removing machining, which also include changeable cutting inserts and cutting plates, comprise a substrate or a basic body with a single-layer or multi-layer wear protection coating deposited optionally thereon. The substrate is usually made of hard metal, cermet, ceramic, steel or high-speed steel and the wear protection coating of hard substances which are applied by the CVD or PVD process. The coating with hard substances is designed to improve the cutting properties of the tool for a particular application and to reduce the Wear of the tool.

It is also known for cutting tools to be provided with a usually thin outermost layer having a decorative and/or indicative function, for example an outermost layer of TiN, ZrN, TiC, HfC or HfN which expediently differs in colour from the underlying wear protection coating. In addition to having a purely decorative purpose, such layers can also advantageously serve for wear recognition as when the tool is used they wear and the underlying layer becomes visible, so that it can be seen with the naked eye whether a tool has already been used and how intensively.

EP 1 762 638 describes a cutting insert consisting of a hard metal substrate and a multi-layer coating of hard material for protection against wear and an outermost indicative layer of ZrN which is initially applied with a thickness of <1 µm by means of PVD and is then removed again from the cutting face and the cutting edge by brushing or abrasive blasting as the layer of ZrN as such has unfavorable tribological properties which can have a disadvantageous influence on the cutting properties at the cutting edge and cutting face.

DE 10 2004 010 285 and DE 100 48 899 also describe cutting tools with an indicative covering coating of golden yellow TiN or of TiC, HfC or HfN which differ in colour from the underlying wear protection coating, and are designed to make it possible to differentiate between a used cutting tool and an unused cutting tool with the naked eye.

The breadth of colour variation of the known covering layers with a decorative and/or indicative function, which are referred to in the following as wear recognition layers, is extremely limited. The nitrides and carbides used very frequently for wear recognition layers have for example a golden yellow colour. Apart from this, some of the known wear recognition coatings have disadvantageous tribological properties which have a disadvantageous effect on the metal cutting process and the wear characteristics of the tools. Some of the known materials used for the production of wear recognition coatings are also not sufficiently stable when exposed to the high temperatures or temperature changes occurring in many metal machining processes.

Objective

Therefore, the underlying objective of the invention was to provide a coating for cutting tools with a decorative and/or indicative function (wear recognition layer) which is comparatively easy and inexpensive to produce, allows good wear recognition, is temperature-stable, has fewer tribologically disadvantageous influences on the cutting process and the wear characteristics of the tool and at the same time can be produced in a broader variety of colours than known wear recognition coatings.

Description of the Invention

According to the invention, this objective is achieved by a tool, consisting of a substrate body, preferably made of hard metal, cermet, ceramic, steel or high-speed steel, optionally a single-layer or multi-layer wear protection coating deposited on the substrate body and a single-layer wear recognition layer (A) arranged as the outermost layer over the substrate body or the wear protection coating, or a multi-layer wear recognition layer (B) comprising at least four individual layers arranged one over another, produced by deposition of elemental metals, metal alloys or electrically conductive metal compounds by the PVD process, wherein the individual layer of the single-layer wear recognition layer (A) or at least one individual layer of the multi-layer wear recognition layer (B) contains at least two different metals, the wear recognition layer comprises a region produced by anodic oxidation of the material of the wear recognition layer from the outer surface of the wear recognition layer to a depth of penetration which does not extend beyond the total thickness of the wear recognition layer, the individual layer of the single-layer wear recognition layer (A) exhibits a thickness in the range of from 100 nm to 10 µm or each individual layer of the multi-layer wear recognition layer (B) exhibits a thickness in the range of from 0.5 nm to 1 µm and the individual layer of the single-layer wear recognition layer (A) or the at least one individual layer of the multi-layer wear recognition layer (B) containing at least two different metals exhibits at least two different phases prior to the anodic oxidation and in the regions of the wear recognition layer not oxidised anodically.

The present invention comprises and differentiates between forms of embodiment with a single-layer wear recognition layer (A) which is also referred to as a mono-layer structure, and forms of embodiment with a multi-layer wear recognition layer (B) which is also referred to as a multi-layer structure.

The single-layer wear recognition layer (A) comprises only a single layer but which due to the anodic oxidation carried out after the PVD deposition of the layer comprises a region extending from the outer surface of the wear recognition layer into the layer in which the material of the layer is present in oxidised state, and a region extending from the oxidised region to the surface of the substrate body or the wear protection coating in which the material of the layer is present in the non-oxidised state.

The multi-layer wear recognition layer (B) comprises at least four individual layers and can preferably comprise up to 2000 individual layers, wherein the wear recognition layer (B) due to the anodic oxidation carried out after the PVD deposition comprises a region extending from the outer surface of the outermost individual layer into the multi-layer wear recognition layer (B) in which the material is present in the oxidised state, and a region extending from the oxidised region to the surface of the substrate body or the wear protection coating in which the material of the layer is present in the non-oxidised state. The depth of penetration of the anodic oxidation can extend over a plurality of individual layers. Alternatively, only the outermost individual layer of the multi-layer wear recognition layer (B) can also be oxidised anodically. Preferably the anodic oxidation ends at the interface between two individual layers inside the multi-layer wear recognition layer (B).

The wear recognition layer according to the invention exhibits significant advantages compared with known decorative and indicative layers, such as for example TiN, which due to its high affinity to cast iron for example, has disadvantages as a coating for tools for machining such materials. At its surface the wear recognition layer according to the invention has oxidic properties which can have major advantages compared with known nitride or carbide layers from tribological viewpoints. Thus, these tribologically advantageous properties reduce unfavorable influences on the cutting properties and the wear characteristics of the tool.

Depending on the metals employed or the electrically conductive metal compounds employed and the extent of the anodic oxidation and the layer thickness, the wear recognition layers according to the invention exhibit good to high level temperature stability, for which reason they are particularly suitable for tools for metal-removing machining in which very high temperatures or temperature change stresses occur frequently.

A further advantage of the wear recognition layers according to the invention is that depending on the metals used or the electrically conductive metal compounds used and the extent and depth of penetration of the anodic oxidation, a very intensive colour effect, a very large number of different colours and levels of brightness which cover almost the entire visible colour spectrum, can be produced. In this way not only can external surface coatings be produced serving for wear recognition, but also tools can be marked by different colourings so that the user can discriminate between different sorts of tool or types of tool on the basis of the colour alone. Thus, the wear recognition layer according to the invention can exclusively have a wear recognition function or can serve for colour coding of the tools in addition to the wear recognition function. In comparison with known wear recognition layers, the wear recognition layers according to the invention can exhibit a much higher brilliance of colouring. The voltages required for the anodic oxidation when producing the wear recognition layers according to the invention can vary.

Without tying themselves to a theory in this connection, the inventors assume that the colouring effect of the wear recognition layer according to the invention is based on the reflection of light which impinges on the non-oxidised inner region of the wear recognition layer through the outer region of the wear recognition layer produced by anodic oxidation. Interference effects provide the colours to be observed. In particular cases, the colouring effect can also be based on the inherent colour of the anodically oxidised outer region of the wear recognition layer.

One essential feature of the present invention is that the individual layer of the single-layer wear recognition layer (A) or the at least one individual layer of the multi-layer wear recognition layer (B) containing at least two different metals exhibits at least two different phases prior to the anodic oxidation and in the regions of the wear recognition layer not oxidised anodically. It was surprisingly discovered that due to the presence of at least two different phases in at least one individual layer of the wear recognition layer, different shades of colour can be produced to those in known or comparable coatings in which the individual layers do not exhibit at least two different phases in at least one individual layer.

For the purposes of the present invention, the term "phase" within a multi-phase layer of the wear recognition layer denotes regions of identical crystal structure and chemical composition. Two different phases for the purposes of the present invention exhibit either the same crystal structure and a different chemical composition, a different crystal structure and the same chemical composition or a different crystal structure and a different chemical composition.

The multi-phase nature of the individual layer of the single-layer wear recognition layer (A) prior to the anodic oxidation and in the regions not oxidised anodically can be demonstrated according to the invention in the X-ray diffraction spectrum. The specialist in the art will be familiar with the method and will immediately see from the spectrum whether the layer is a single phase or two-phase or multi-phase layer. In a multi-layer wear recognition layer (B) comprising at least four individual layers arranged one over another, the precise assignment of a plurality of different phases to just one layer of the multi-layer wear recognition layer in the X-ray diffraction spectrum is not immediately possible as the method measures as a whole over a plurality of layers. However, the multiple phases within an individual layer which contains at least two different metals can be demonstrated by transmission electron microscopy (TEM) on a test piece with a prepared cross-section by means of electron diffraction (ED). Obviously, this method is also suitable for demonstrating the multiple phases of the individual layer of the single-layer wear recognition layer (A).

In a first variant of the present invention, the wear recognition layer has a single layer, i.e. it consists of an individual layer produced by deposition of at least two different metals in elemental form, in the form of metal alloy or in the form of electrically conductive metal compounds by the PVD process. The individual layer exhibits a thickness in the range of from 100 nm to 10 µm and at least two different phases. If the individual layer contains for example two different metals M1 and M2, the different phases can be a first metallic phase of the metal M1, a second metallic phase of the metal M2 and an intermetallic phase of the metals M1 and M2. The different phases can be demonstrated in the X-ray diffraction spectrum. It was found surprisingly that with a single-layer wear recognition layer consisting of a single layer with at least two different metals and at least two different phases within the single layer, colours of greater brilliance and clarity can be obtained than with a single layer containing only a single metal.

In a second variant of the present invention, the wear recognition layer has multiple layers, i.e. it consists of at least four individual layers deposited by the PVD process and arranged one over another. Each individual layer contains either a metal or a plurality of different metals, wherein metals in elemental form, in the form of metal alloy or electrically conductive metal compounds can be deposited.

Each individual layer of the multi-layer wear recognition layer exhibits a thickness in the range of from 0.5 nm to 1 µm. At least one individual layer of the multi-layer wear recognition layer exhibits at least two different phases.

After the PVD deposition, the wear recognition layer is subjected to anodic oxidation. During the anodic oxidation, the coated tool is connected as anode in an electrolyte bath. The oxidation takes place at a predetermined voltage which for example can lie in the range of from 20 to 150 V and also outside this range, for a selected period of time which can lie in the range of from 10 to 300 seconds or outside this range. The voltage applied, the duration of the oxidation, the selected electrolyte and finally the composition of the wear recognition layer are the essential parameters which determine the depth of penetration of the anodic oxidation from the outer surface of the wear recognition layer in the direction of the substrate. Depending on the depth of penetration, different colour effects are obtained. The parameters of the anodic oxidation are chosen so that the oxidation takes place to a depth of penetration which does not extend over the total thickness of the wear recognition layer, as it is assumed that the colouring effect of the wear recognition layer according to the invention is based on the reflection of light on the non-oxidised inner region of the wear recognition layer. It is therefore advantageous to obtain such a non-oxidised region of the wear recognition layer by adjustment of the depth of penetration of the anodic oxidation.

The phases which are present inside an individual layer containing at least two different metals prior to the anodic oxidation and in the regions which have not been oxidised anodically can be identified by means of X-ray diffraction analysis and/or TEM. In the regions of the wear recognition layer which were subjected to anodic oxidation, different phases are no longer discernible in the X-ray diffraction spectrum or TEM. The methods of X-ray diffraction analysis and TEM will be known to the specialist in the art and require no further explanation. The differentiation of the different phases in an X-ray diffraction spectrum can be carried out by comparing the peak positions with those of corresponding known references. For example, phases of the individual metals are identified by comparison with the reference spectra of the pure metals and intermetallic phases by comparison with the reference spectra of the corresponding alloys. The differentiation of the different phases by means of TEM is effected by means of electron diffraction.

In one preferred form of embodiment of the invention, the individual layer of the single-layer wear recognition layer (A) exhibits a thickness of from 250 nm to 5 µm, preferably of from 400 nm to 2 µm, particularly preferably of from 500 nm to 1.2 µm. If the individual layer of the single-layer wear recognition layer (A) is too thin, there is a danger that the anodic oxidation will take place over the total thickness of the wear recognition layer down to the underlying wear protection coating or down to the substrate and the wear protection coating or the substrate is attacked by the usually acid electrolyte of the anodic oxidation. If the individual layer of the wear recognition layer with a monolayer structure is too thick, this has a disadvantageous effect on the tribological properties of the coating and hence a disadvantageous effect on the metal cutting process and the wear characteristics of the tools. Apart from this, if the individual layer is too thick, there is a danger that the layer is easily detached from the substrate or the wear protection coating during the cutting process.

In one preferred form of embodiment of the invention, the multi-layer wear recognition layer (B) comprises 4 to 2000, preferably 20 to 500, particularly preferably 50 to 100 individual layers arranged one over another. The individual layers are very thin, preferably they exhibit a thickness of from 5 nm to 250 nm, particularly preferably of from 10 nm to 100 nm. If the number of individual layers is too low, with the reduced thickness of the individual layers there is a danger that the anodic oxidation will take place over the total thickness of the wear recognition layer down to the underlying wear protection coating or down to the substrate and the wear protection coating or the substrate is attacked by the usually acid electrolyte of the anodic oxidation. If the number of individual layers is too high, the total thickness of the wear recognition layer is very large, which can have an unfavorable effect on the tribological properties of the coating and thus an unfavorable effect on the cutting process and the wear characteristics of the tools. Apart from this, if the wear recognition layer is too thick, there is a danger that the layer will become easily detached from the substrate or the wear protection coating during the cutting process.

In a further preferred form of embodiment of the invention, the metals contained in the single-layer wear recognition layer (A) or the multi-layer wear recognition layer (B) are selected from Nb, Ti, Zr, Al, Ta, W, Hf, V, Mo and Si. If electrically conductive metal compounds are deposited in the PVD process, these are preferably selected from nitrides, carbides and borides of the previously named metals provided these are electrically conductive.

The metals contained in the individual layer of the single-layer wear recognition layer (A) or in the individual layer of the multi-layer wear recognition layer (B) containing at least two different metals are quite particularly preferably Ti and Si. This combination of the metals Ti and Si delivers brilliant colours and allows the production of a large number of different colours in the visible spectrum. In the X-ray diffraction spectrum of an individual layer containing only the metals Ti and Si, at least three phases are identified, a metallic Ti phase, a metallic Si phase and at least one intermetallic TiSi phase, the proportion of the metallic Ti and Si phases estimated from the X-ray diffraction spectrum being high in relation to the at least one intermetallic TiSi phase.

An X-ray diffraction spectrum of an individual layer which only contains the metals Ti and Si is shown in FIG. 1. The individual layer was deposited by the arc PVD process from a composite target containing Ti and Si in an atomic % ratio of 85:15 with a layer thickness of 0.8 µm with an evaporator current of 160 A, an Ar pressure of 2 Pa and a bias of 10 V.

In a further preferred form of embodiment of the invention, the metals contained in the individual layer of the single-layer wear recognition layer (A) or in the individual layer of the multi-layer wear recognition layer (B) containing at least two different metals are deposited by the PVD process from mixed metal targets which contain all the metals present in the individual layer.

In a further preferred form of embodiment of the invention, the multi-layer wear recognition layer (B) exhibits a total layer thickness of from 2 nm to 20 µm, preferably of from 10 nm to 5 µm, particularly preferably of from 100 nm to 1 µm. If the total layer thickness is too small, there is a danger that the anodic oxidation will take place over the total thickness of the wear recognition layer down to the underlying wear protection coating or down to the substrate and the wear protection coating or the substrate is attacked by the usually acid electrolyte of the anodic oxidation. If the total layer thickness of the wear recognition layer is too large, this can have a disadvantageous effect on the tribological properties of the coating and hence a disadvantageous effect on the cutting process and the wear characteristics of the tools. Apart from this, if the wear recognition layer is too thick, there is a danger that the layer will detach easily from the substrate or the wear protection coating during the cutting process.

In one particularly preferred form of embodiment of the invention, a single-layer or multi-layer wear protection coating, preferably a multi-layer wear protection coating, which preferably comprises at least one electrically non-conductive layer and particularly preferably comprises an aluminium oxide layer, is arranged on the substrate body under the wear recognition layer.

The application of the wear recognition layer according to the invention over a non-conductive wear protection layer, quite particularly preferably over an aluminium oxide layer, which due to its hardness and resistance to wear is advantageously employed in many tools for metal-cutting machining as a wear protection layer, on its own or in combination with other layers of hard material, has the particular advantage that during the process of anodic oxidation of the wear recognition layer so-called punctures cannot occur during the anodizing process due to the non-conductive layer lying underneath it. Then, the wear recognition layer can be made very thin.

In a further preferred form of embodiment of the invention, the PVD processes for application of the individual layer or individual layers of the wear recognition layer from metal, metal alloy or electrically conductive metal compound can be selected from arc evaporation, HIPIMS and dual magnetron sputtering. Targets of different composition are used for the deposition of the multi-layer wear recognition layer according to the different layer compositions. Here, the deposition can be effected from the different targets using the same PVD process. However, different PVD processes can also be used for the different targets. A multi-layer wear recognition layer with alternating different layer compositions, in particular when very thin layers are to be produced, can be deposited in a PVD process in which the different targets are distributed in different positions in the reactor and the side of the tool body to be coated is run past the different targets repeatedly in turn, for example by multiple rotation on an indexing table or the like.

In a further preferred form of embodiment of the invention, the wear recognition layer is removed again from selected regions of the tool, preferably by an abrasive blasting process with a particulate blasting medium, by grinding or by brushing. It may be desirable for certain regions of the tool to exhibit the surface of the substrate body or the wear protection coating as the outermost surface, for example on the cutting edge and on the face, when a wear recognition layer in these regions might impart unfavorable properties to the tool for the particular proposed application, or simply in order to impart a desired optical character to the tool. In addition, the abrasive processes can be used to remove the wear recognition layer, such as for example blasting methods or brushing, in order to smooth the surface roughness of the corresponding regions or to influence the inherent stress conditions in the wear protection coating and optionally also the outer substrate regions. As is known, blasting processes with particulate blasting media can be used to relieve tensile stresses in layers of hard materials and/or to apply compressive stresses, with which for example the adhesion and wearing properties of the layers can be improved.

The anodic oxidation of the wear recognition layer is effected in an electrolyte bath with a DC voltage and for a time which are selected so that the anodic oxidation is effected from the outer surface of the wear recognition layer to a depth of penetration which is less than the total thickness of the wear recognition layer. An example of a suitable electrolyte bath is an aqueous solution with 25-50% phosphoric acid and 1-5% oxalic acid.

The invention also comprises a method for the production of a tool of the kind according to the invention previously described herein in which a wear recognition layer of the kind according to the invention described herein is applied by means of a PVD process to a tool consisting of a substrate body made of hard metal, cermet, ceramic, steel or high-speed steel, which optionally exhibits a single-layer or multi-layer wear protection coating deposited on the substrate body and then the wear protection layer is subjected to anodic oxidation in an electrolyte bath. The anodic oxidation is expediently carried out with a DC voltage and for a time which are selected so that the anodic oxidation is effected from the outer surface of the wear recognition layer to a depth of penetration which is less than the total thickness of the wear recognition layer. The method is simple and inexpensive and offers the possibility of producing many different colourings.

For the purposes of the original disclosure, it is pointed out that all the features as revealed to a specialist in the art from the present description and the dependent claims, even when they were described in concrete terms only in conjunction with certain further features, can be combined both individually and also in any combinations with others of the features or groups of features disclosed here, provided this was not expressly excluded or technical reasons make such combinations impossible or pointless. No comprehensive explicit description of all the conceivable combinations of features will be given here solely to keep the description brief and legible.

Further advantages, features and possible applications of the present invention will be explained further with reference to the following examples and the figures.

FIGURES

EXAMPLES

Figure 1:
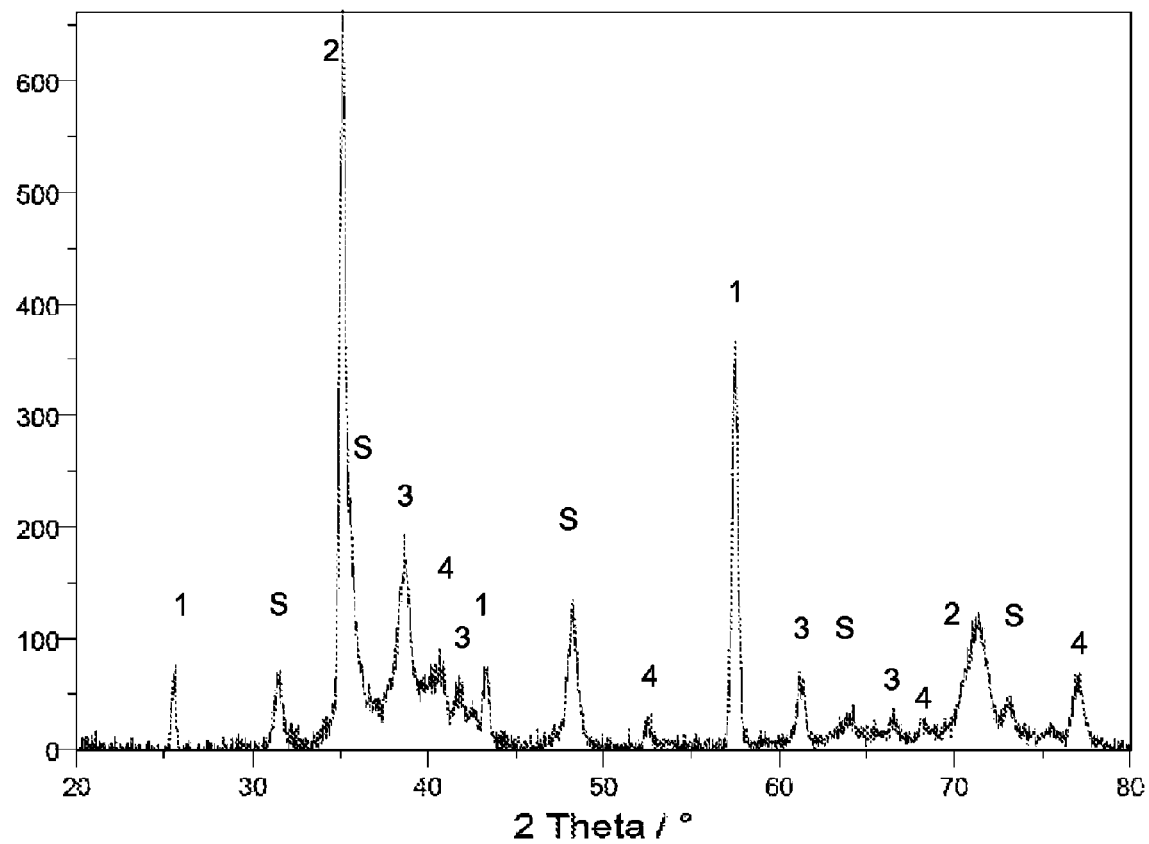
FIG. 1 shows the X-ray diffraction spectrum of a wear recognition layer containing the metals Ti and Si according to example 1 prior to the anodic oxidation.

For the following examples hard metal substrates exhibiting a wear protection coating with an outermost layer of $Al_2O_3$ were provided with a single-layer or multi-layer wear protection layer in a PVD coating installation (Flexicoat; Hauzer Techno Coating) by means of arc evaporation (arc PVD). The deposition parameters are indicated in the respective examples.

Then the coated hard metal substrates were subjected to anodic oxidation in an aqueous electrolyte bath for an anodizing time $t_{anod}$ at different voltages $U_{anod}$. The thickness of the oxide produced by the anodic oxidation was essentially proportional to the voltage applied.

The peaks of the X-ray diffraction spectra shown in the figures for the layers produced according to the examples were compared with the peak positions of the known reference spectra (PDF cards) in order to identify the phases contained in a layer. In the figures the peaks associated with a phase are therefore marked with the same number (e.g. 1, 2, 3 or 4). Peaks which originate from the substrate body are marked with the letter "S". The numbers of the PDF cards used in each case are indicated in the captions for the figures.

Example 1

Production of a Single-layer Wear Recognition Layer According to the Invention

| | |
|---|---|
| Target | Titanium-silicon mixed target (Ti:Si = 85:15 atom %) |
| Deposition parameters | 160 A evaporator current, 2 Pa argon, bias 10 V |
| Layer | Single layer; 0.8 µm thick |
| Anodic oxidation | $t_{anod}$ = 30 sec; $U_{anod}$ = 35 V, 85 V, 120 V; electrolyte bath: 35% phosphoric acid, 5% oxalic acid, rest water |

The following colours were obtained for the wear recognition layer:

| $U_{anod}$ | Colour |
|---|---|
| 35 V | Blue |
| 85 V | Pinkish violet |
| 120 V | Light green |

The wear recognition layer deposited by the PVD process was subjected to an X-ray diffraction analysis prior to the anodic oxidation. The X-ray diffraction spectrum is reproduced in FIG. 1. The comparison of the peaks obtained with the reference spectra of pure titanium, pure silicon, and titanium-silicon alloy shows that the deposited single layer exhibits at least three different metallic phases, a metallic titanium phase, a metallic silicon phase and an intermetallic titanium-silicon phase. A further unidentified peak at approximately 53° 2-theta shows a further probable intermetallic phase, however this peak was not found in the known reference spectra, which leads one to conclude that this phase has not yet been recorded or published as a reference.

Example 2

Production of a Single-layer Wear Recognition Layer According to the Invention

| | |
|---|---|
| Target | Titanium-aluminium mixed target (Ti:Al = 50:50 atom %) |
| Deposition parameters | 160 A evaporator current, 1.5 Pa argon, bias 20 V |
| Layer | Single layer; 1.0 µm thick |
| Anodic oxidation | $t_{anod}$ = 30 sec; $U_{anod}$ = 50 V, 80 V; electrolyte bath: citric acid (1 mol/l) dissolved in water |

The following colours were obtained for the wear recognition layer:

| $U_{anod}$ | Colour |
|---|---|
| 50 V | Green |
| 80 V | Yellow |

The wear recognition layer deposited by the PVD process was subjected to an X-ray diffraction analysis prior to the anodic oxidation. The X-ray diffraction spectrum is reproduced in FIG. 2. The comparison of the peaks obtained with the reference spectra of pure titanium, pure aluminium and titanium-aluminium alloy shows that the deposited single layer exhibits at least two different metallic phases, a metallic titanium phase and a metallic aluminium phase. A further unidentified peak at approximately 43° 2-theta shows a further probably intermetallic titanium-aluminium phase, however this peak was not found in the known reference spectra, which leads one to conclude that this phase has not yet been recorded or published as a reference.

Example 3

Production of a Multi-layer Wear Recognition Layer According to the Invention

| | |
|---|---|
| Target 1 | Titanium |
| Target 2 | Titanium-aluminium mixed target (Ti:Al = 50:50 atom %) |
| Deposition parameters | 160 A evaporator current, 1.0 Pa argon, 50 sccm $N_2$, bias 60 V |
| Layer | 40 layers (20 Ti layers, 20 Ti—Al layers); each 18 nm thick; total layer thickness: 0.72 µm |
| Anodic oxidation | $t_{anod}$ = 30 sec; $U_{anod}$ = 80 V, 150 V; electrolyte bath: citric acid (1 mol/l) dissolved in water |

The following colours were obtained for the wear recognition layer:

| $U_{anod}$ | Colour |
|---|---|
| 80 V | Reddish gold |
| 150 V | Blueish green |

The wear protection coating deposited during the PVD process was subjected to an X-ray diffraction analysis prior to the anodic oxidation. The X-ray diffraction spectrum is reproduced in FIG. 3. The comparison of the peaks obtained with the reference spectra of pure titanium, pure aluminium and titanium-aluminium alloy shows that the deposited single layer exhibits at least two different metallic phases, a metallic titanium phase and a metallic aluminium phase. A further unidentified peak at approximately 37° 2-theta shows a further probably intermetallic titanium-aluminium phase, however this peak was not found in the known reference spectra, which leads one to conclude that this phase has not been recorded or published as a reference yet.

Electron diffraction (TEM) revealed that at least two different phases of the phases found in the X-ray diffraction analysis are present inside at least one individual layer of the multi-layer layer. As three phases were observed in the X-ray diffraction analysis and only two different layer compositions were deposited in alternation one over another, the X-ray diffraction analysis shows that at least two different phases are present in one of the individual layers.

Comparison Example 1

Production of a Single-layer Wear Recognition Layer

| | |
|---|---|
| Target | Titanium (160 mm diameter) |
| Deposition parameters | 160 A evaporator current, 1.0 Pa argon, bias 10 V |
| Layer | Single layer; 1.0 µm thick |
| Anodic oxidation | $t_{anod}$ = 30 sec; $U_{anod}$ = 20 V, 40 V; electrolyte bath: citric acid (1 mol/l) dissolved in water |

The following colours were obtained for the wear recognition layer:

| $U_{anod}$ | Colour |
|---|---|
| 20 V: | Pink |
| 40 V: | Blue |

The wear recognition layer deposited during the PVD process was subjected to an X-ray diffraction analysis prior to the anodic oxidation. The X-ray diffraction spectrum is reproduced in FIG. 4. The comparison of the peaks obtained with the reference spectrum of pure titanium shows that the deposited single layer consists of a single metallic Ti phase.

Comparison Example 2

Production of a Single-layer Wear Recognition Layer

| | |
|---|---|
| Target | Zirconium (160 mm diameter) |
| Deposition parameters | 160 A evaporator current, 2.0 Pa argon, bias 30 V |
| Layer | Single layer; 0.5 µm thick |
| Anodic oxidation | $t_{anod}$ = 30 sec; $U_{anod}$ = 50 V, 85 V; electrolyte bath: citric acid (1 mol/l) dissolved in water |

The following colours were obtained for the wear recognition layer:

| $U_{anod}$ | Colour |
|---|---|
| 50 V: | Light blue |
| 85 V: | Yellow |

The wear recognition layer deposited during the PVD process was subjected to an X-ray diffraction analysis prior to the anodic oxidation. The X-ray diffraction spectrum is reproduced in FIG. 5. The comparison of the peaks obtained with the reference spectrum of pure zirconium shows that the single layer deposited consists of a single metallic Zr phase.

The wear recognition layers of the present invention according to examples 1 to 3 showed a significantly better resistance to scratching and abrasion and a visually assessed higher colour brilliance compared with the layers of the comparison examples.

REFERENCES/CAPTIONS

References/caption for FIG. 1:

| | |
|---|---|
| S | Substrate PDF 25-1047 |
| 1 | Si PDF 40-932 |
| 2 | Ti PDF 5-682 |
| 3 | TiSi PDF 27-907 |
| 4 | Unidentified |
| I | Intensity (arbitrary units) |

Figure 2:
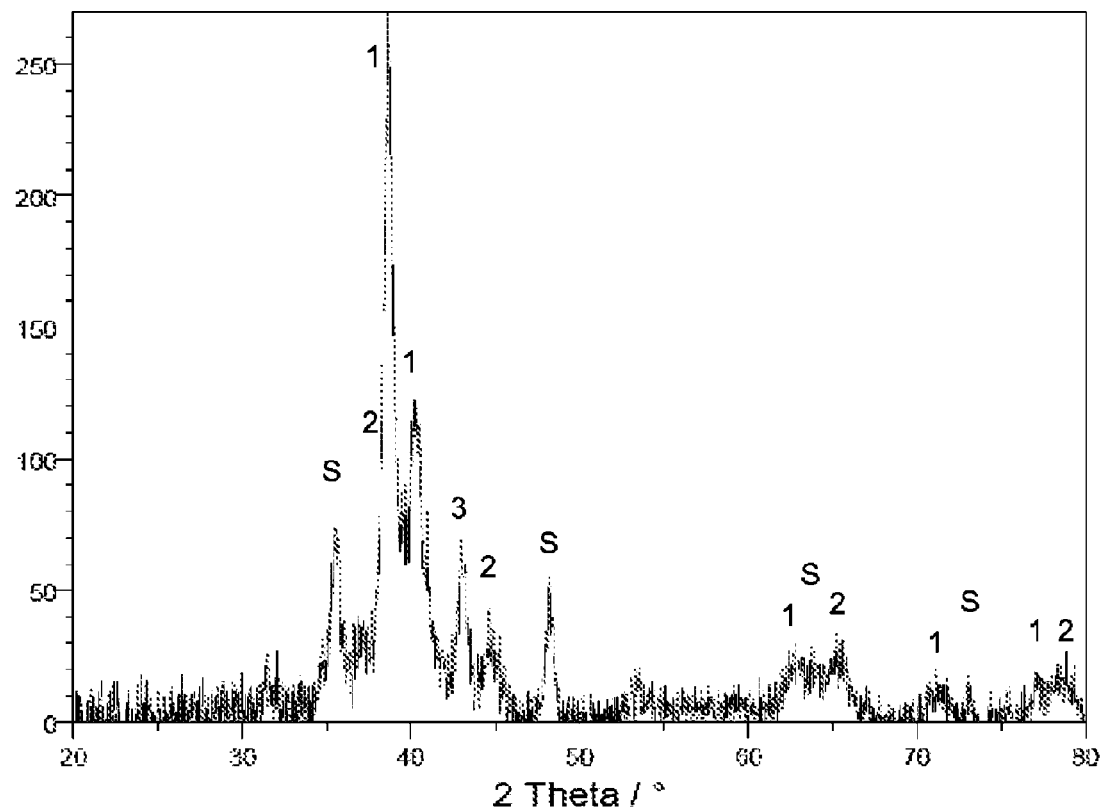
FIG. 2 shows the X-ray diffraction spectrum of a wear recognition layer containing the metals Ti and Al according to example 2 prior to the anodic oxidation.

References/caption for FIG. 2:

| | |
|---|---|
| S | Substrate PDF 25-1047 |
| 1 | Ti PDF 5-682 |
| 2 | Al PDF 4-787 |
| 3 | Unidentified TiAl phase |
| I | Intensity (arbitrary units) |

Figure 3:
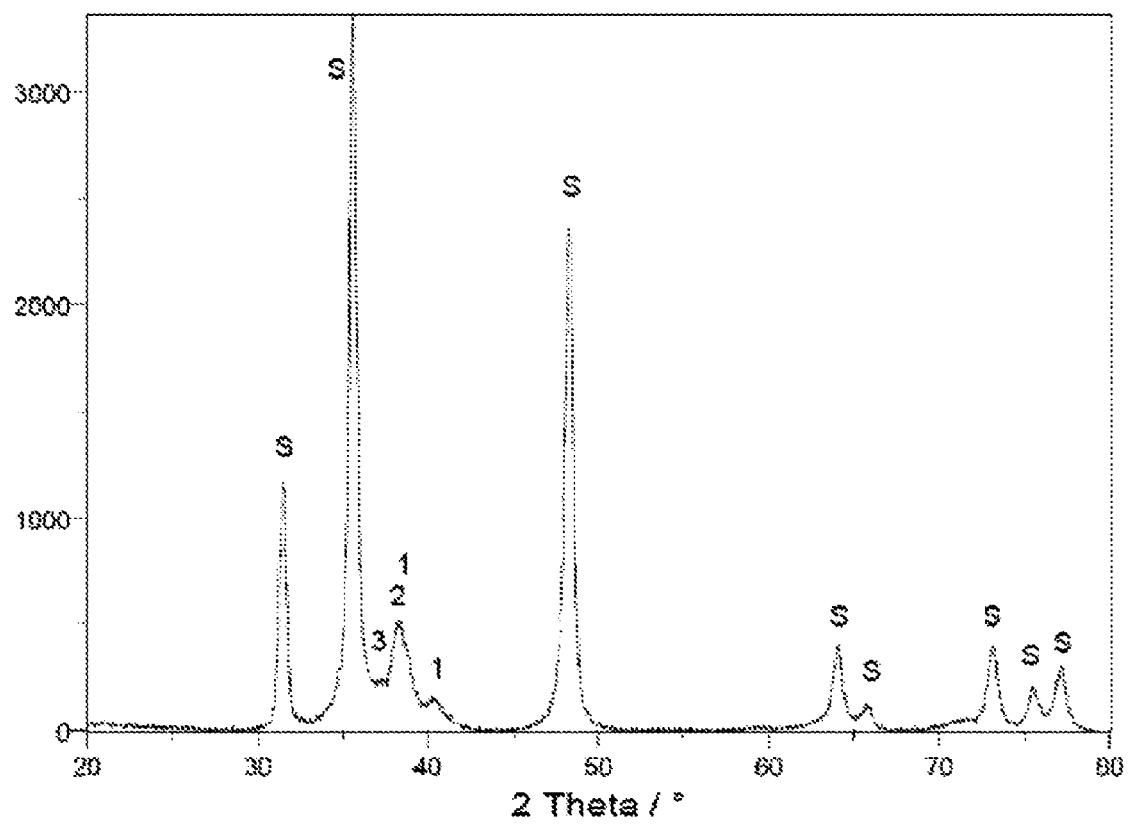
FIG. 3 shows the X-ray diffraction spectrum of a wear recognition layer containing the metals Ti and Al according to example 3 prior to the anodic oxidation.

References/caption for FIG. 3:

| | |
|---|---|
| S | Substrate PDF 25-1047 |
| 1 | Ti PDF 5-682 |
| 2 | Al PDF 4-787 |
| 3 | Unidentified TiAl phase |
| I | Intensity (arbitrary units) |

Figure 4:
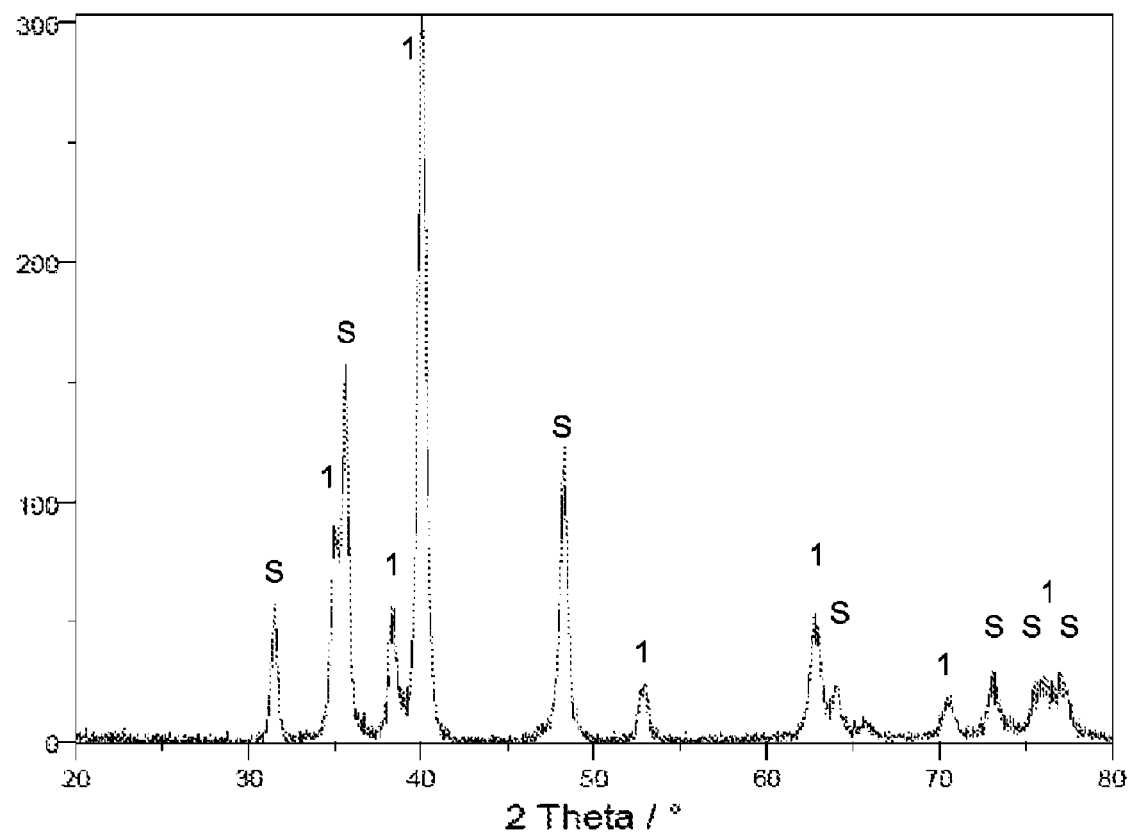
FIG. 4 shows the X-ray diffraction spectrum of a wear recognition layer containing the metal Ti according to comparison example 1 prior to the anodic oxidation.

References/caption for FIG. 4:

| | |
|---|---|
| S | Substrate PDF 25-1047 |
| 1 | Ti PDF 5-682 |
| I | Intensity (arbitrary units) |

Figure 5:
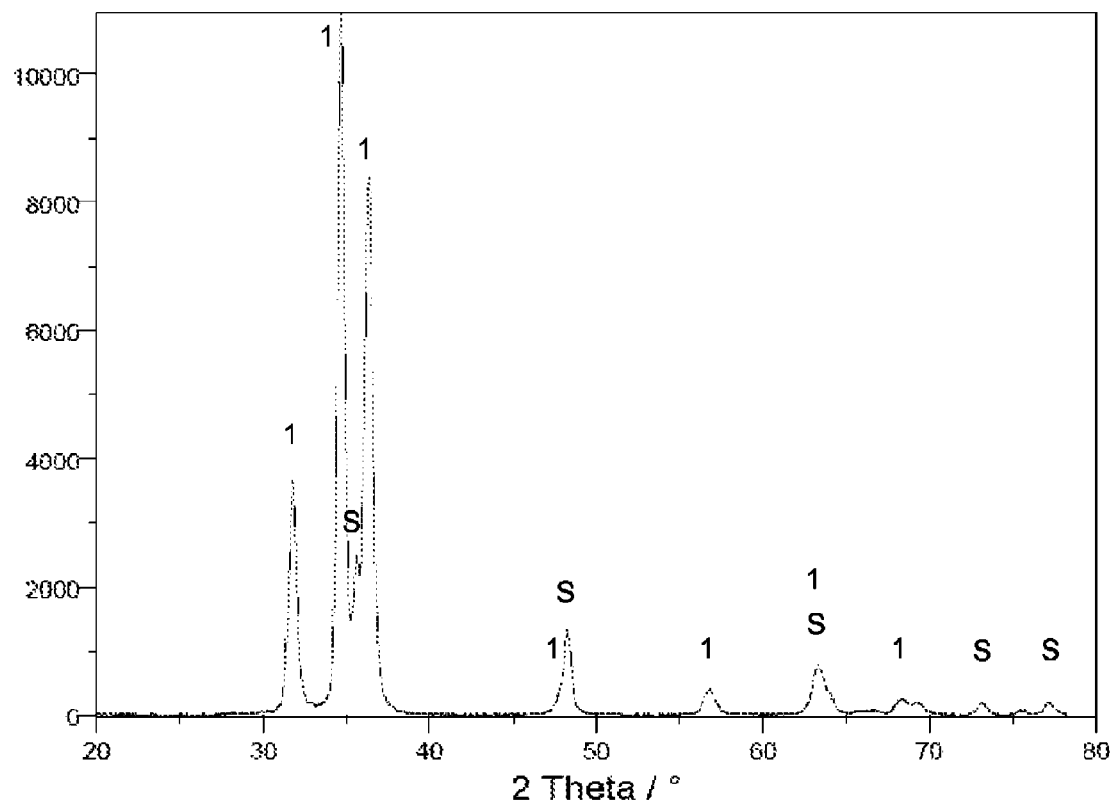
FIG. 5 shows the X-ray diffraction spectrum of a wear recognition layer containing the metal Zr according to comparison example 2 prior to the anodic oxidation.

References/caption for FIG. 5:

| | |
|---|---|
| S | Substrate PDF 25-1047 |
| 1 | Zr PDF 5-665 |
| I | Intensity (arbitrary units) |

The invention claimed is:

1. Tool, consisting of:
   a substrate body made of hard metal, cermet, ceramic, steel or high-speed steel,
   optionally a single-layer or multi-layer wear protection coating deposited on the substrate body, and
   a multi-layer wear recognition coating comprising at least four individual layers arranged one over another, the multi-layer wear recognition coating deposited as the outermost layer over the substrate body or the wear protection coating and being produced by deposition of elemental metals, metal alloys or electrically conductive metal compounds by a PVD process, wherein
   at least one individual layer of the multi-layer wear recognition coating contains at least two different metals,
   the wear recognition coating comprises a region produced by anodic oxidation of the material of the wear recognition coating from the outer surface of the wear recognition coating to a depth of penetration which does not extend beyond the total thickness of the wear recognition coating,
   each individual layer of the multi-layer wear recognition coating exhibits a thickness in the range of from 0.5 nm to 1 µm, and the at least one individual layer of the multi-layer wear recognition coating containing at least two different metals exhibits at least two different phases prior to the anodic oxidation and in the regions of the wear recognition coating not oxidised anodically.

2. Tool according to claim 1, wherein the individual layers of the multi-layer wear recognition coating each exhibit a thickness of from 5 nm to 250 nm.

3. Tool according to claim 2, wherein the thickness of each of the individual layers of the multi-layer wear recognition coating is from 10 nm to 100 nm.

4. Tool according to claim 1, wherein the metals contained in the multi-layer wear recognition coating are selected from Nb, Ti, Zr, Al, Ta, W, Hf, V, Mo and Si.

5. Tool according to claim 1, wherein the metals contained in the individual layer of the multi-layer wear recognition coating containing at least two different metals are Ti and Si.

6. Tool according to claim 1, wherein the metals contained in the individual layer of the multi-layer wear recognition coating containing at least two different metals are deposited by the PVD process from mixed metal targets which contain all the metals present in the individual layer.

7. Tool according to claim 1, wherein the multi-layer wear recognition coating comprises 4 to 2000 individual layers arranged over one another.

8. Tool according to claim 7, wherein the multi-layer wear recognition coating comprises 20 to 500 individual layers arranged over one another.

9. Tool according to claim 1, wherein the multi-layer wear recognition coating exhibits a total layer thickness of from 2 nm to 20 μm.

10. Tool according to claim 9, wherein the multi-layer wear recognition coating exhibits a total layer thickness of from 10 nm to 5 μm.

11. Tool according to claim 1, wherein the electrically conductive metal compounds deposited during the PVD process are selected from nitrides, carbides and borides of the respective metals, provided the compounds are electrically conductive.

12. Tool according to claim 1, wherein the single-layer or multi-layer wear protection coating is arranged on the substrate body under the wear recognition coating.

13. Tool according to claim 1, wherein the PVD processes for the application of the individual layers of the wear recognition coating from elemental metal, metal alloy or electrically conductive metal compound are selected from arc evaporation, HIPIMS and dual magnetron sputtering.

14. Tool according to claim 1, wherein the wear recognition coating is removed again from selected regions of the tool.

15. Method for the production of a tool with a wear recognition coating according to claim 1, comprising:
applying a multi-layer wear recognition coating from metal, metal alloy or electrically conductive metal compound by the PVD process to a tool consisting of a substrate body made of hard metal, cermet, ceramic, steel or high-speed steel,
optionally depositing a single-layer or multi-layer wear protection coating on the substrate body, and
then subjecting the wear recognition coating to anodic oxidation in an electrolyte bath,
wherein the anodic oxidation is carried out at a DC voltage and for a time which are selected so that the anodic oxidation is effected from the outer surface of the multi-layer wear recognition coating to a depth of penetration which is less than the total thickness of the wear recognition coating.

16. Tool according to claim 1, wherein the wear protection coating is a multi-layer wear protection coating and is arranged on the substrate body under the wear recognition coating.

17. Tool according to claim 16, wherein the multi-layer wear protection coating comprises at least one electrically non-conductive layer.

18. Tool according to claim 17, wherein the at least one electrically non-conductive layer is an aluminium oxide layer.

19. Method according to claim 1, wherein the single-layer or multi-layer wear protection coating is deposited on the substrate body under the wear recognition coating.

20. Method according to claim 1, wherein the wear protection coating is a multi-layer wear protection coating and is deposited on the substrate body under the wear recognition coating.

* * * * *